(12) United States Patent
Joshi et al.

(10) Patent No.: US 11,775,729 B2
(45) Date of Patent: Oct. 3, 2023

(54) TECHNOLOGY FILE PROCESS RULE VALIDATION

(71) Applicant: Samsung Electronics Co., Ltd., Suwon-si (KR)

(72) Inventors: Phaniraj Joshi, Bengaluru (IN); Pilwon Kang, Suwon-si (KR); Kyuwon Lee, Suwon-si (KR); Youngrog Jo, Suwon-si (KR); Zameer Iqbal, Bengaluru (IN); Nitin Kishorkumar Ingole, Bengaluru (IN)

(73) Assignee: Samsung Electronics Co., Ltd.

( * ) Notice: Subject to any disclaimer, the term of this patent is extended or adjusted under 35 U.S.C. 154(b) by 148 days.

(21) Appl. No.: 17/381,499

(22) Filed: Jul. 21, 2021

(65) Prior Publication Data

US 2022/0350949 A1  Nov. 3, 2022

(30) Foreign Application Priority Data

May 3, 2021 (IN) .............................. 202141020215

(51) Int. Cl.
*G06F 30/398* (2020.01)

(52) U.S. Cl.
CPC .................................. *G06F 30/398* (2020.01)

(58) Field of Classification Search
CPC .. G03F 9/7076; G03F 9/7084; G03F 7/70616; G03F 1/84; G06F 30/398; G06F 30/31; G06F 30/33; G06F 30/392; G06F 30/323; G06F 30/327; G06F 30/3323; G06F 30/333; G06F 30/337; G06F 30/34; G06F 30/343; G06F 30/367; G06F 30/30; G06F 30/39; G06F 2119/12; G06F 30/394; G06F 8/20; H01L 2224/73253; H01L 21/823475; H01L 21/823842; H01L 29/66795; H01L 29/785; H01L 21/76254
USPC .................................................. 716/100–108
See application file for complete search history.

(56) References Cited

U.S. PATENT DOCUMENTS

| | | |
|---|---|---|
| 6,732,338 B2 | 5/2004 | Crouse et al. |
| 6,915,252 B1 | 7/2005 | Li |
| 7,823,103 B2 | 10/2010 | Pokorny |
| 8,661,379 B1 | 2/2014 | Atsatt |
| 8,677,297 B2 | 3/2014 | Chase et al. |
| 8,875,064 B2 | 10/2014 | Aggarwal et al. |
| 9,372,952 B1 | 6/2016 | Sun et al. |

(Continued)

FOREIGN PATENT DOCUMENTS

CN          101169803 B       4/2012

*Primary Examiner* — Binh C Tat
(74) *Attorney, Agent, or Firm* — Myers Bigel, P.A.

(57) ABSTRACT

A method and system disclosed for validating technology file design rules, including obtaining a technology file with design rules that are to be validated. An input test case library is obtained with design rule cell-views for each corresponding design rules. The design rule cell-view includes a first set of failed test cases. An output data is generated by using Design Rule Driven (DRD) tool, to test the design rules based on the design rule cell-views. The test output data provides a second set of failed test cases associated with the corresponding design rule. A validation result is determined for each of the plurality of design rules based on the first set of failed test cases and the second set of failed test cases associated with the design rule. Finally, a validation report is generated including the validation result for each design rules.

20 Claims, 9 Drawing Sheets

(56) References Cited

U.S. PATENT DOCUMENTS

| | | |
|---|---|---|
| 9,934,349 B2 | 4/2018 | Bhawnani et al. |
| 10,755,026 B1 * | 8/2020 | Luo ........................ G06N 3/045 |
| 2005/0268258 A1 * | 12/2005 | Decker ................... G06F 30/33 |
| | | 716/112 |
| 2011/0219342 A1 * | 9/2011 | Socha ..................... G06F 30/00 |
| | | 716/52 |

* cited by examiner

FIG. 6

| A_Rule ID | Test Case | DRD pct | DRD Conui | TC Conui | PVS pct | DRD False | PVS False |
|---|---|---|---|---|---|---|---|
| met1.1 | X | 100 | 11 | 11 | 0 | | |
| met1.2 | X | 83 | 15 | 18 | 0 | | |
| met1.5 | X | 0 | 0 | 0 | 0 | | |
| met1.6 | X | 100 | 17 | 17 | 0 | | |
| met1.7 | X | 12 | 3 | 24 | 0 | | |
| met2.10 | - | 0 | 0 | 0 | 0 | | |
| met2.11 | - | 0 | 0 | 0 | 0 | | |
| met2.12 | - | 0 | 0 | 0 | 0 | | |
| met2.1 | X | 100 | 11 | 11 | 0 | | |
| met2.3 | X | 0 | 0 | 0 | 0 | | |
| met2.4 | X | 94 | 16 | 17 | 0 | | |
| met2.6 | X | 0 | 0 | 0 | 0 | | |
| met2.9 | - | 0 | 0 | 0 | 0 | | |
| met3.10 | - | 0 | 0 | 0 | 0 | | |
| met3.11 | - | 0 | 0 | 0 | 0 | | |
| met3.12 | - | 0 | 0 | 0 | 0 | | |

FIG. 7

| Rule Name | Cell Name | Fail Markers | Missing | DRD pct | False | Comment |
|---|---|---|---|---|---|---|
| CB.OL.PB.2 | GRCB_OL_PB_2 | 10 | 8 | 20 | 0 | 1 case to y3-Tech File Modified |
| CB.OL.PB.3 | GRCB_OL_PB_3 | 6 | 5 | 16 | 0 | Test case – Irregular CB shapes |
| CB.OL.PB.4 | GRCB_OL_PB_4 | 5 | 0 | 100 | 1 | Test case – Irregular CB shapes |
| CB.OL.PB.6 | GRCB_OL_PB_6 | 2 | 2 | 0 | 0 | X |
| CB.OL.PC.1 | GRCB_OL_PC_1 | 5 | 0 | 100 | 4 | |
| CB.OL.PC.2 | GRCB_OL_PC_2 | 3 | 3 | 0 | 0 | X |
| CB.S.1 | GRCB_S_1 | 15 | 0 | 100 | 10 | Shown by CB.S.5 – DRD – 3 cases to y3 – point Touch Not Detected – width error |
| CB.S.2 | GRCB_S_2 | 5 | 0 | 100 | 3 | Shown by CB.S.6 (pct = 1 value = 0.036) |
| CB.S.3 | GRCB_S_3 | 6 | 6 | 0 | 0 | CB.S.6, CB.S.2 shown error |
| CB.S.4 | GRCB_S_4 | 4 | 4 | 0 | 0 | CB.S.6, CB.S.1 shown error |
| CB.S.5 | GRCB_S_5 | 5 | 0 | 100 | 5 | |
| CB.S.6 | GRCB_S_6 | 2 | 2 | 0 | 0 | |
| CB.S.7 | GRCB_S_7 | 8 | 0 | 100 | 0 | |
| CB.S.8 | GRCB_S_8 | 3 | 3 | 0 | 0 | Test case – Irregular CB shapes |
| CB.S.9 | GRCB_S_9 | 18 | 18 | 0 | 0 | X |
| CB.S.CA.1 | GRCB_S_CA_1 | 17 | 0 | 100 | 4 | Test File – Added overlapNotAllowed |
| CB.S.CA.2 | GRCB_S_CA_2 | 3 | 3 | 0 | 0 | X |
| CB.S.PB.1 | GRCB_S_PB_1 | 17 | 0 | 100 | 5 | Test File – Added overlapNotAllowed |
| CB.S.PB.2 | GRCB_S_PB_2 | 4 | 4 | 0 | 0 | X |
| CB.S.PC.1 | GRCB_S_PC_1 | 17 | 0 | 100 | 4 | Test File – Added overlapNotAllowed |
| CB.S.RXFIN.1 | GRCB_S_RXFIN_1 | 17 | 0 | 100 | 6 | Test File – Added overlapNotAllowed |
| CB.S.RXFIN.2 | GRCB_S_RXFIN_2 | 17 | 0 | 100 | 7 | |
| CB.S.RXFIN.3 | GRCB_S_RXFIN_3 | 4 | 4 | 0 | 0 | X |
| CB.S.RXFIN.4 | GRCB_S_RXFIN_4 | 4 | 4 | 0 | 0 | X |
| CB.W.1 | GRCB_W_1 | 4 | 0 | 100 | 0 | |
| CB.W.2.or | GRCB_W_2_or | 11 | 0 | 100 | 1 | 1 case to y3-Non-rectangular shape-allowedWidthRanges will not find – rectShape Dir shows error- |

TECHNOLOGY FILE PROCESS RULE VALIDATION

CROSS-REFERENCE TO RELATED APPLICATION

This U.S. non-provisional patent application claims priority under 35 U.S.C. § 119 to Indian Patent Application No. 202141020215, filed on May 3, 2021, the entire contents of which are hereby incorporated by reference.

FIELD OF THE INVENTION

The present disclosure, in general, relates to designing of an integrated circuit, and more particularly to a system and method for performing validation of design rules that are required to successfully design the integrated circuit.

BACKGROUND

With increase in complexity of integrated circuit designs over the years, the requirement of verifying each step in the process of the designing has become vital. In a typical integrated circuit design procedure, the integrated circuit design is first created in a high-level design language intended to characterize, at a high level, behavior of integrated circuits.

Once the Integrated circuit design has been completed in the high-level language, the high-level representation is compiled or re-written to produce a behavioral model in a low-level language. Furthermore, the design is compiled again to a gate level schematic representation of the integrated circuit design.

From the gate level schematic representation, the design may then be converted to a standard cells physical layout which is created using auto place and route tool and may also be created using custom drawn methods. The standard cells are then interconnected to implement the logic of the integrated circuit design and to create the external connections. A physical design file is created from the standard cell design, which is then converted into a set of masks used in the process of constructing an actual integrated circuit. Thus, it is clearly understood that the integrated circuit design from the highest level to an actual physical implementation has multiple very crucial steps.

One particular crucial step of interest is the step of implementing a Process Design Kit (PDK) Library containing a technology file with a set of process rules to design the layout design of the integrated circuit. The technology file is used by various placement and routing methodologies and system such as a Design Rule Driven (DRD) editor that helps to optimally draw the layout. The process rules are used to set the physical parameters such parameters as the placement, wiring, and geometrical layout of the integrated circuit chip. Moreover, it is necessary that every chip manufactured is checked and verified that it complies with the given process rules. Therefore, various conventional techniques are provided for checking and verifying that the integrated circuit chip is in order to the corresponding design rules to ensure that the geometric shapes of the circuits are placed in proper proximal distance from one another, because incorrect placements will lead to chip failure. Also, it is advisable to find and correct errors before going to silicon so that correction costs by an order of magnitude is reduced.

But the problem is the tremendous magnitude of the number of tests required to verify the complex chips of the state-of-the-art architecture. With complex chips, billions of tests are required. For this reason, the industry required design verification methods that are more limited in scope. The researchers sought to introduce a validation technique to verify the process rules for designing are in absolute correct order. The aim is to fix any error in the technology file so that it is ensured that the input command to physical designing of the integrated circuit chip is correct. The present invention is one individual aspect of the validation problem that is accomplished from the other computer-aided techniques.

Now, one of the most complex challenge lies in verifying the immense technology information, complex process rules specially when using advanced node PDKs and ensuring that the consistency of these process rules is in correspondence with physical verification rule file.

A conventional technique known in the industry discusses to generate test cases for validating technology file rules. The known technology in prior art does not verify whether the layer geometrics are DRD compliant or not. Therefore, the layer geometry editing is conventionally missing from the available technologies. With several other limitation, the known techniques suffer from constraints to provide an efficient and short turnaround time process for validating technology files.

SUMMARY

This summary is provided to introduce a selection of concepts, in a simplified format, that are further described in the detailed description of the invention. This summary is neither intended to identify key or essential inventive concepts of the invention and nor is it intended for determining the scope of the invention.

The present invention discloses a method of validating technology file design rules, including obtaining a technology file including a plurality of design rules that are to be validated; obtaining an input test library including a plurality of design rule cell-views corresponding to the plurality of design rules, wherein each design rule cell-view includes a first set of failed test cases associated with a corresponding one of the plurality of design rules; testing, using a Design Rule Driven (DRD) tool, the plurality of design rules based on the plurality of design rule cell-views to obtain test output data, wherein the test output data includes, for each of the plurality of design rules, a second set of failed test cases associated with the corresponding one of the plurality of design rules; determining a validation result for each of the plurality of design rules based on the first set of failed test cases and the second set of failed test cases associated with the corresponding one of the plurality of design rules, the validation result being indicative of efficacy of the corresponding one of the plurality of design rules; and generating a validation report including the validation result for each of the plurality of design rules.

In an aspect of the invention, the first set of failed test cases are marked as per a first marking scheme and wherein the second set of failed test cases are marked as per a second marking scheme.

In an aspect of the invention, determining the validation result, includes for each of the plurality of design rules: comparing the first set of failed test cases with the second set of failed test cases; identifying a number of failed test cases that are included in both the first set of failed test cases and the second set of failed test cases, based on the first marking scheme and the second marking scheme; determining a percentage based on the identified number of failed test cases and the first set of failed test cases; and determining the percentage as the validation result for the design rule.

In an aspect of the invention, a design rule in the plurality of design rules for which a corresponding design rule cell-view is not available in the plurality of design rule cell-views may be identified. Accordingly, the design rule in the validation report may be marked to indicate that the corresponding design rule cell-view for the design rule is not available in the plurality of design rule cell-views.

In an aspect of the invention, each of the plurality of design rule cell-views include a plurality of test cases, wherein each test case of the plurality of test cases is one of pass test case and fail test case.

In another aspect of the invention, for each of the plurality of design rule cell-views, a check on whether the plurality of test cases included in the design rule cell-view is compliant with one or more DRD tool requirements may be performed. Accordingly, at least one test case that is determined to be non-compliant to the one or more DRD tool requirements may be modified.

In another aspect of the invention, for each of the plurality of design rule cell-views, a marker layer to each of the plurality of test cases included in the design rule cell-view may be added as per the first marking scheme, wherein a first marker is added when the test case is a failed test case, and wherein a second marker is added when the test case is a pass test case.

In yet another aspect of the invention, for each of the plurality of design rule cell-views, a marker text indicative of the corresponding design rule to each of the plurality of test cases included in the design rule cell-view may be added.

The present invention solves the deficiencies of the conventional known art by providing a novel and inventive technique to validate the technology file rules or constraints. This involves generating test cases for all the routing/non-routing layer related design rules, running the DRD compliance for the test cases and generating report over the accuracy of the constraints. The present invention further identifies missing technology file process rules by referring to the Technology Design rule manual.

In conclusion, the present invention facilitates a technique to qualify the huge technology file process rules in advanced node PDKs in short span of time by arranging the test cell-views into a library with each cell-view representing the design rule and the corresponding cell-view naming convention.

To further clarify advantages and features of the present invention, a more particular description of the invention will be rendered by reference to specific embodiments thereof, which is illustrated in the appended drawings. It is appreciated that these drawings depict only typical embodiments of the invention and are therefore not to be considered limiting of its scope. The invention will be described and explained with additional specificity and detail with the accompanying drawings.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 6 illustrates a sample generated output result in a tabular format, according to the embodiments of the invention; and FIG. 7 illustrates a detailed report in a tabular format, according to the embodiments of the invention.

Figure 1:
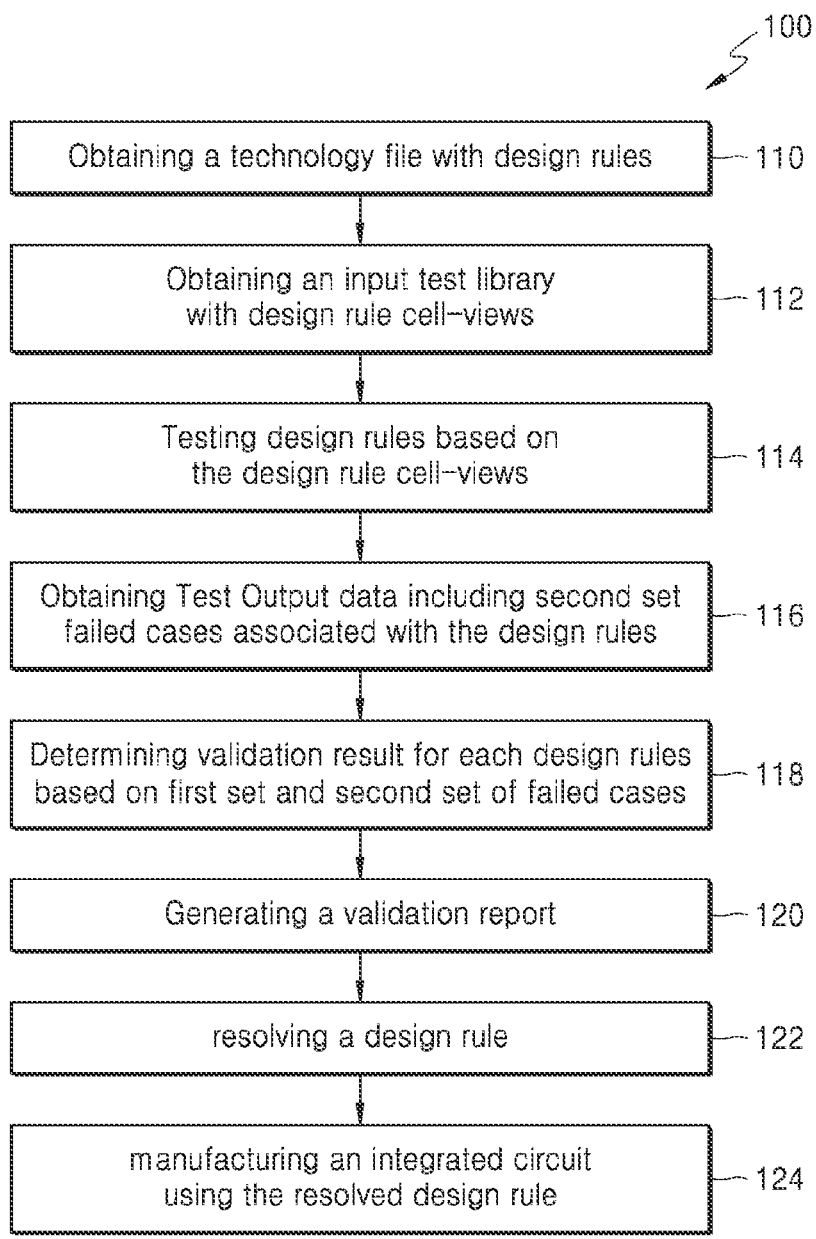
FIG. 1 is a flow diagram illustrating a method for validating a technology file design rules, according to the embodiments of the invention.

Further, skilled artisans will appreciate that elements in the drawings are illustrated for simplicity and may not have been necessarily drawn to scale. For example, the flow charts illustrate the method in terms of the most prominent steps involved to help to improve understanding of aspects of the present invention. Furthermore, in terms of the construction of the device, one or more components of the device may have been represented in the drawings by conventional symbols, and the drawings may show only those specific details that are pertinent to understanding the embodiments of the present invention so as not to obscure the drawings with details that will be readily apparent to those of ordinary skill in the art having benefit of the description herein.

DETAILED DESCRIPTION OF FIGURES

For promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated system, and such further applications of the principles of the invention as illustrated therein being contemplated as would normally occur to one skilled in the art to which the invention relates.

It will be understood by those skilled in the art that the foregoing general description and the following detailed description are explanatory of the invention and are not intended to be restrictive thereof.

Reference throughout this specification to "an aspect", "another aspect" or similar language means that a particular feature, structure, or characteristic described in connection with the embodiment is included in at least one embodiment of the present invention. Thus, appearances of the phrase "in an embodiment", "in another embodiment" and similar language throughout this specification may, but do not necessarily, all refer to the same embodiment.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components.

Unless otherwise defined, all technical and scientific terms used herein have the same meaning as commonly understood by one of ordinary skill in the art to which this invention belongs. The system, methods, and examples provided herein are illustrative only and not intended to be limiting.

Referring now to FIG. 1, a flow diagram of a method 100 for validating technology file design rules, according to the embodiments of the invention is illustrated. In an example, the method 100 includes, at step 110, obtaining a technology file including a plurality of design rules. The design rules are representative of a set of instructions that aids in optimally drawing an integrated circuit layout. The technology file is to be validated in accordance with the embodiments of the invention. The validation of technology file containing the plurality of design process rules, helps in identifying the design rule violations found during physical verification step, thus saving time and cost.

In the next step 112, an input test case library including a plurality of design rule cell-views corresponding to the plurality of design rules is obtained. In an example, the input test case library may be stored in an internal storage of a computing device on which the method 100 is implemented. Accordingly, the input test case library may be obtained from said internal storage. In another example, the input test case library may be stored in a remote storage. In such a case, the computing device may access the remote storage and accordingly, obtain the input test case library from the remote storage.

In an example, each design rule cell-view may include a first set of failed test cases associated with the corresponding design rule. A failed test case may be understood as a layout of a circuit design which is not as per the constraints defined by the design rule corresponding to the design rule cell-view. Furthermore, each of the design rule cell-views may also include a set of pass test cases. A pass test case may be understood as a layout of a circuit design which is as per the constraints defined by the design rule corresponding to the design rule cell-view.

In the next step 114, the plurality of design rules is tested based on the plurality of design rule cell-views. In an example, the testing may be performed using a Design Rule Driven (DRD) tool. In the testing, the DRD tool may be used for checking the applicability of the design rule onto the first plurality of failed test cases. That is, the DRD tool may verify whether the design rule is actually yielding a failed result when applied onto the failed test cases. In all such cases where the design rule wrongly declares a failed test case as pass test case, the DRD tool may put an error marker on such test cases. These test cases may be further identified as a second set of failed test cases.

In an example, the test cases, i.e., the first set of failed test cases and the set of pass test cases, included in the design rule cell-views of the input test case library may be modified prior to the testing to make them compliant to the DRD tool. As the DRD tool validates the plurality of design rules, therefore it is important that the layout in the test cases are of relevant shape and correct size that is in compliance with the DRD tool. In an embodiment the DRD validates the shapes of the cell layout to be in compliance with the drawing purpose with each cell layout having assigned a voltage range value. In a further example embodiment, an Electronic Design Automation (EDA) tool used for designing integrated circuits and printed circuit boards may used for assigning coloring to a multi pattern cell layout prepared by the DRD In the step 116, test output data including the second set of failed test cases associated with each of the design rules are obtained. In the next step 118, a validation result is determined for each of the plurality of design rules based on the first set of failed test cases and the second set of failed test cases associated with the design rule. The validation result indicates an efficacy of the design rules.

In the step 120, a validation report preferably in a tabular format is generated which includes the validation result for each of the plurality of design rules.

It will be understood that an integrated circuit may be manufactured based on the validation report. For example, before manufacturing the integrated circuit, a first design rule, among the plurality of design rules, that is indicated in the validation report as having an unavailable corresponding design rule cell-view, among the plurality of design rule cell-views, may be resolved (step 122). Upon resolving the first design rule, the integrated circuit may then be manufactured (e.g., built on a semiconductor substrate) using the resolved first design rule (step 124).

Figure 2:
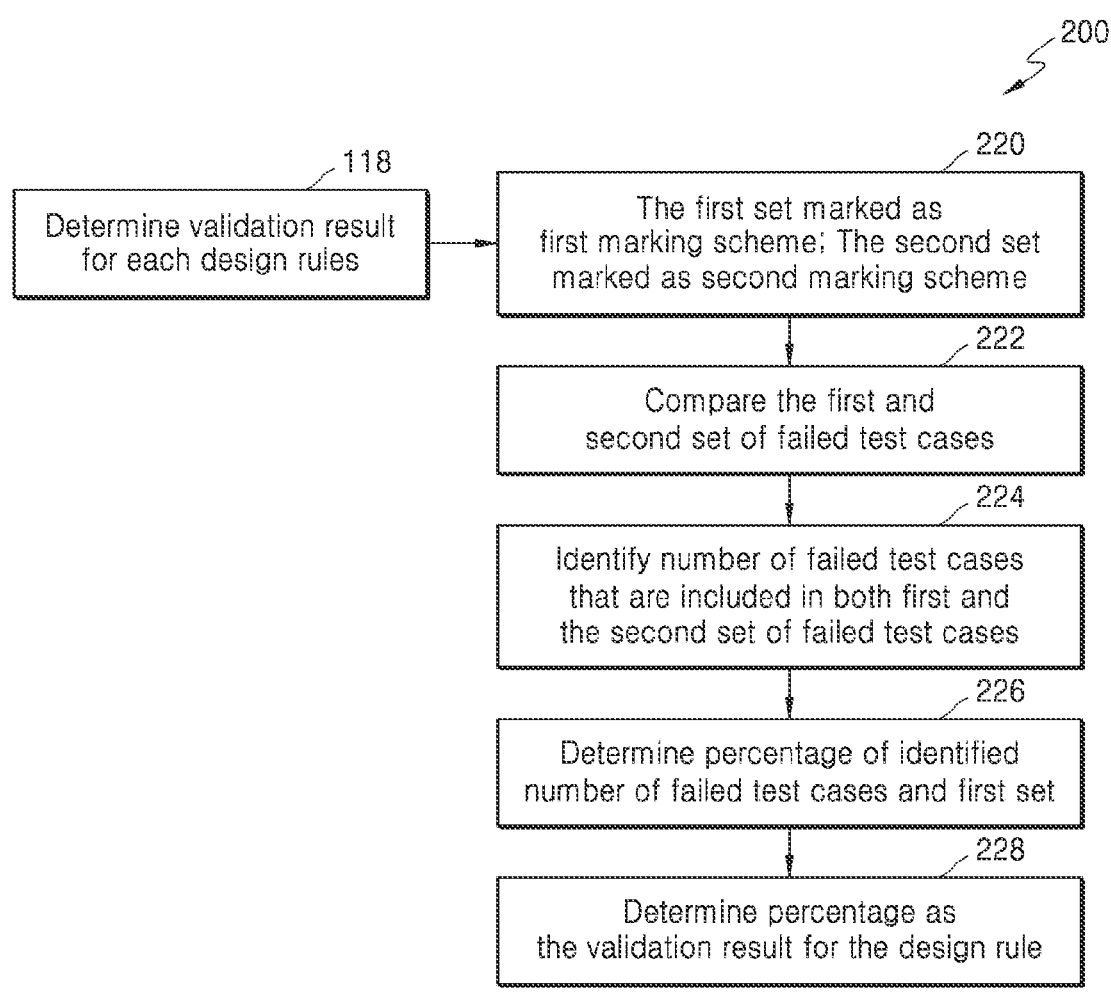
FIG. 2 is a flow diagram illustrating a method for determining a validation result during the validating of the technology file design rules, according to the embodiments of the invention.

Referring to FIG. 2, a flow diagram illustrating a method 200 for determining the validation result, according to an embodiment of the present subject matter. In an example, the method 200 may include the sub-steps of the step 118.

Figure 4:
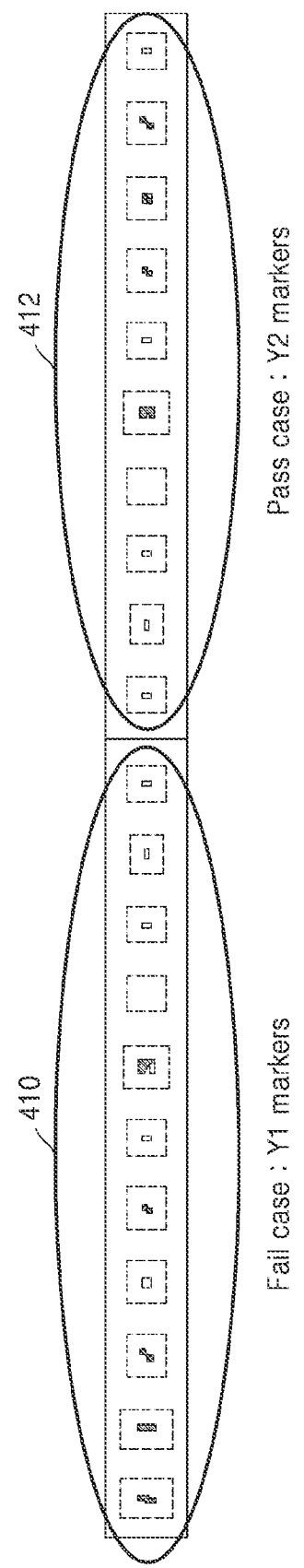
FIG. 4 illustrates an exemplary interface depicting individual cell view for pass and failed test case, according to the embodiments of the invention.

In step 220, the first set of failed test cases are marked as per a first marking scheme and the second set of failed test cases are marked as per a second marking scheme as part of drawing marker layer on the layer geometries. In the present invention, an individual cell view for each design rule to be checked is provided in form of an interface as referred in FIG. 4. FIG. 4 illustrates an exemplary interface depicting the individual cell-view for pass 412 and failed 410 test case, according to the embodiments of the invention.

The marking scheme is used to identify the first or second set of failed test cases. In an example embodiment, a marker for instance Y1 is used to denote the failed test case and a marker Y2 for instance is used to denote the pass test case. The Y1 marker and the Y2 marker are drawn around the test case to provide symbolic representation of fail and pass test case.

Figure 5:
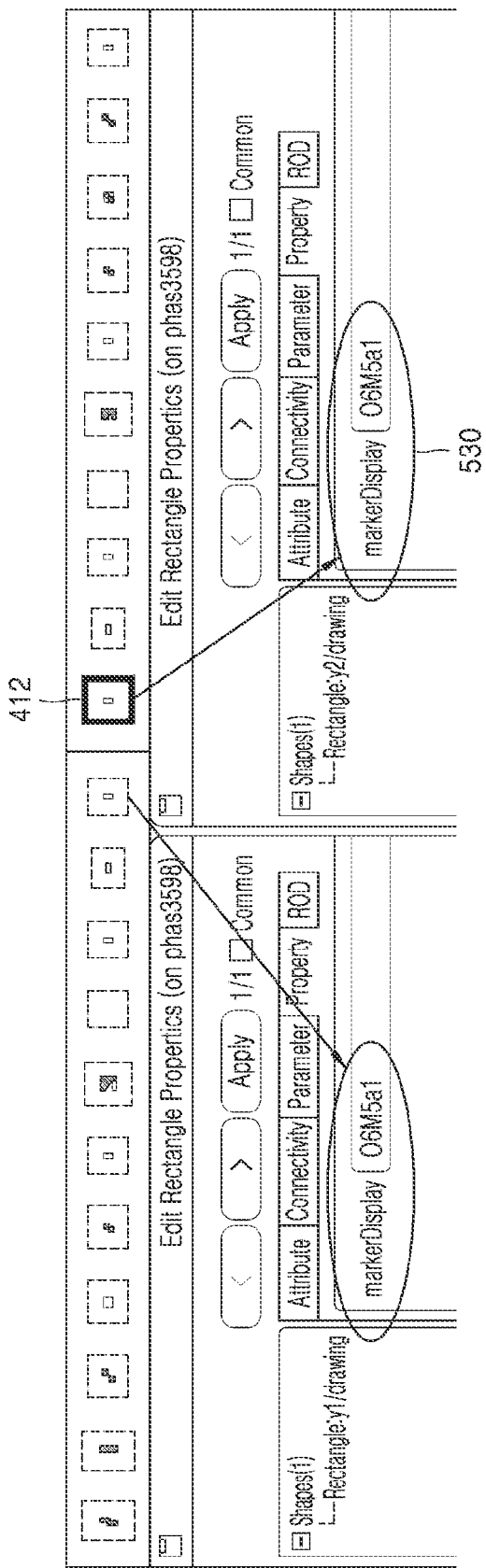
FIG. 5 illustrates an exemplary interface depicting marker display property to the pass and failed test case, according to the embodiments of the invention.

The invention adds a 'rule ID' to all the cell-views. As referred to in FIG. 5 which illustrates an exemplary interface depicting the marker display property or the marker text to the pass and failed test case, according to the embodiments of the invention. The individual cell-view for pass 412 test case has been assigned a unique marker text, displayed as a property 530 in the interface. The marker text is a naming convention to identify the particular individual cell-view. The Y1 marker or the Y2 marker thus is assigned with the marker text which is indicative of the corresponding design rule to each of the plurality of test cases included in the design rule cell-view.

Now in step 222, for each of the plurality of design rules, the present invention discloses to compare the first set of failed test cases with the second set of failed test cases.

Further in the step 224, identification of a number of failed test cases that are included in both the first set of failed test cases and the second set of failed test cases, based on the first marking scheme and the second marking scheme is done. The identification of the number of failed test cases in the step 226, determines a percentage based on the identified number of failed test cases and the first set of failed test cases. Finally, in the step 228, the invention determines the percentage as the validation result for the design rule.

Figure 3:
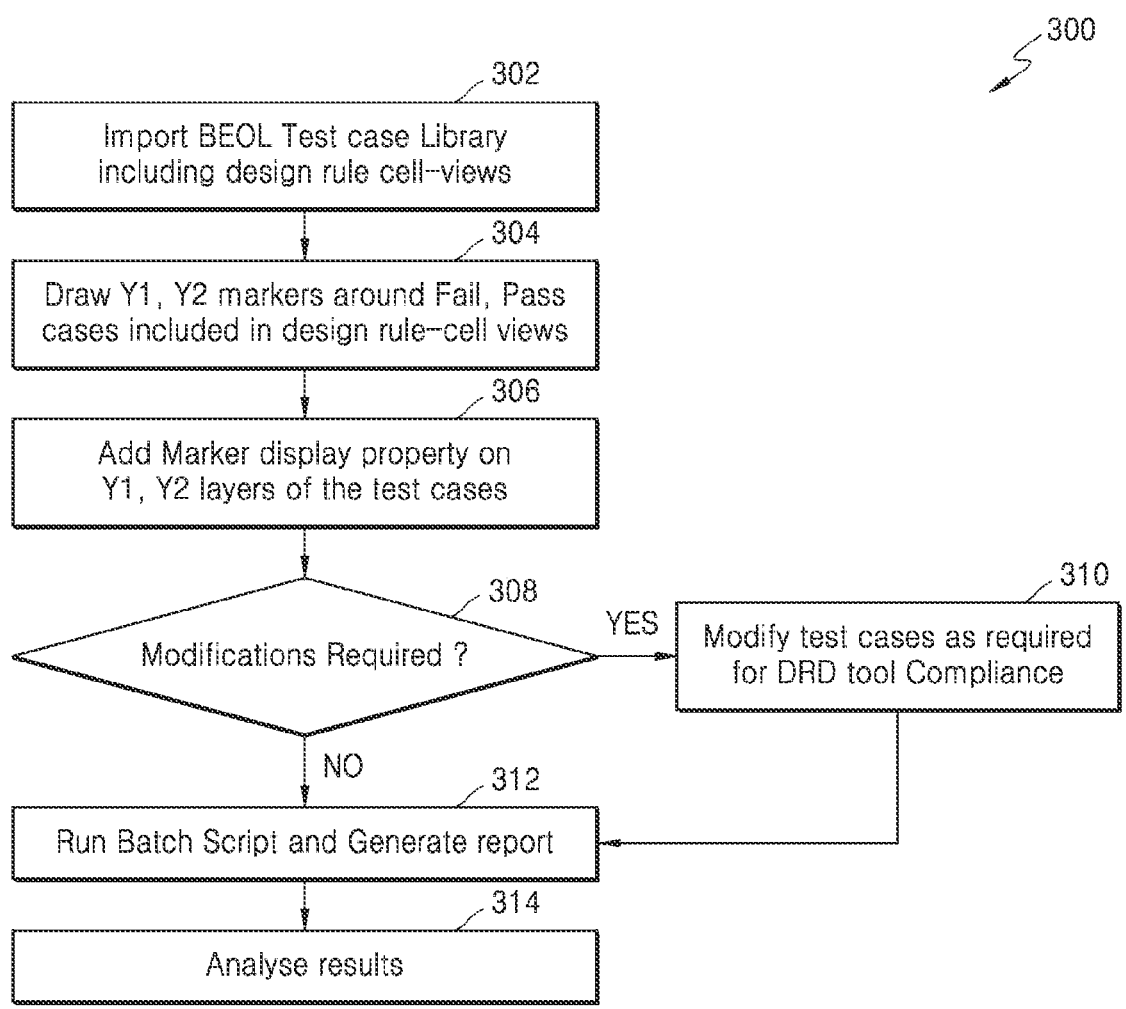
FIG. 3 is a flow diagram illustrating a preferred method of validating technology file design rules, according to the embodiments of the invention.

FIG. 3 illustrates a method 300 of validating technology file design rules, according to an embodiment of the present subject matter.

In step 302, a Back-end-of-the-line (BEOL) test case library may be imported. In an example, an administrator entrusted with the verification or validation of the technology file using a computing device may import the BEOL test case library. The BEOL test case library may include a plurality of design rule cell-views. Each of the design rule cell-views may include a plurality of pass and failed test cases.

In step 304, respective markers around pass test cases and fail test cases are drawn. In an example, the Y1 markers are drawn around the fail test cases and the Y2 markers are drawn around the pass test cases. In step 306, marker display property may be added on the Y1, Y2 layers. In an example, the property may include addition of the name of the corresponding design rule.

In step 308, it may be ascertained whether modifications to the test cases is required or not. In an example, the ascertaining may be done based on the requirements of the DRD tool. That is, the specification of the test cases and the specification requirements of the DRD tool may be cross checked. Accordingly, in case it is ascertained that modifications are required, the method may proceed to step 310. At step 310, the modifications as required may be done to the test cases so as to make them compliant with the DRD tool.

In case it is ascertained that modifications are not required, the method may move to step 312 where batch script is tun and report is generated. The report may include details of failed test cases which are erroneous, in one example. At step 314, the method may include analysing the result. Herein, in an example, the design rules which do not have associated erroneous fail test cases may be highlighted in the report, for example as shown in report 700 of FIG. 7. Accordingly, in the step 314, the administrator may analyse and identify such design rules, and look into the cause of such errors.

In an example embodiment of the present invention, the validation results 600 is referred in the FIG. 6 as a sample generated output result in a tabular format, according to the embodiments of the invention. In the validation results 600, the column 'A Rule ID' 620 is representative of particular design rule to be validated. The column 'test case' 630 with value, for the instance the value is represented with 'X' illustrates that the test case for a corresponding design rule is available. Whereas in an aspect, the present invention identifies a design rule in the plurality of design rules for which a corresponding design rule cell-view is not available. Then, the design rule for which the corresponding design rule cell-view is absent is marked with a value of '-' in the column 'test case' 630 representing that the test cell-view is not available or missing for a corresponding design rule.

In the column named 'TC Count' 660, which represents total test case count in the test case library and is calculated by reading the Y1 markers on the failed test cases. In the column named 'DRD count' 650, represents count of test cases successfully validated by the DRD and is computed by reading a DRD marker generated in combination with Y1 markers. The column 'DRD count' 650 is the total number of test patterns that DRD correctly marked in the test case layout.

In the column named 'DRD pct' 640 is the percentage of test patterns that DRD correctly marked in the test case layout. It is represented as percentage, which is calculated based on the following equation:

$$DRD\ pct = (DRD\ count/TC\ Count)*100$$

In the sample validation results 600, the DRD pct column with value equals to 100 represents that successfully validated test cell-view.

In the column named 'PVS pct' 670, represents the percentage of test patterns that DRD and a Physical Verification System (PVS) correctly marked in the test case library.

In the FIG. 7, a sample detailed report 700 in a tabular format is illustrated, according to the embodiments of the invention. The sample detailed report 700 may be analysed and the analysis provides an advantage of validating the technology file and identify the missing process rules in technology file. The sample detailed report analysis verifies consistency of the technology file process rules with the DRC rule file thus helping in drawing correct DRC layout with reduced iterations, reduced physical verification in short turn-around time.

Figure 8:
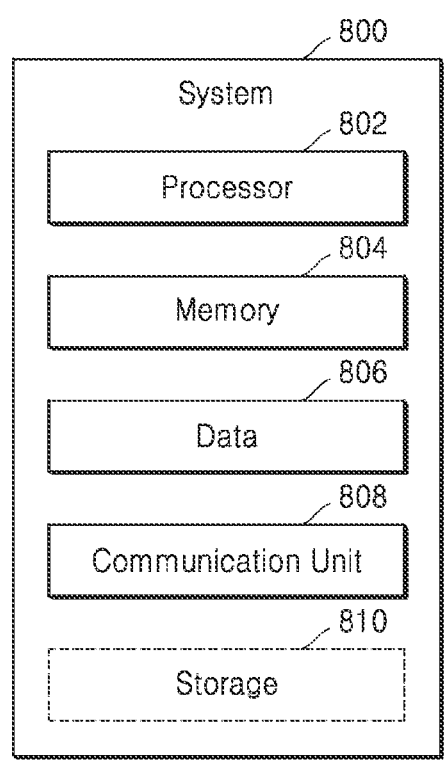
FIG. 8 illustrates a block diagram of a system for validating technology file design rules, according to some implementations of the present disclosure.

FIG. 8 illustrates a system 800, according to an embodiment of the present subject matter. In an example, the system 800 may be implemented in electronic devices, such as a laptop, a desktop computer, a workstation computer, a server, etc. In an example, the system 800 may be implemented either in a single device or in a distributed manner in a plurality of device, the implementation of which would be apparent to a person skilled in the art.

In an example, the system 800 may include a processor 802, memory 804 (memory device), data 806, and a communication unit 808. In an example, the system 800 may include or may be communicatively coupled with a storage 810. Thus, the storage 810 may be either an internal storage or an external storage.

In an example, the processor 802 may be a single processing unit or a number of units, all of which could include multiple computing units. The processor 802 may be implemented as one or more microprocessors, microcomputers, microcontrollers, digital signal processors, central processing units, state machines, logic circuitries, and/or any devices that manipulate signals based on operational instructions. Among other capabilities, the processor 802 is configured to fetch and execute computer-readable instructions and data stored in the memory 804.

The memory 804 may include any non-transitory computer-readable medium known in the art including, for example, volatile memory, such as static random access memory (SRAM) and dynamic random access memory (DRAM), and/or non-volatile memory, such as read-only memory (ROM), erasable programmable ROM, flash memories, hard disks, optical disks, and magnetic tapes.

The data 806 serves, amongst other things, as a repository for storing data processed, received, and generated by one or more of the processor 802. Writing further, in a non-limiting manner, one or more of the aforementioned components of the system 800 may send or receive data, for example, using one or more input/output ports and one or more communication units.

In an example, the communication unit 808 may include one or more hardware units that support wired or wireless communication between the processor 802 and processors of other electronic devices. For instance, the communication unit 808 may facilitate a connection between an electronic device implementing the system 800 and a database or a storage that includes the input test library. In an example, the database or storage may be the storage 810.

In an example, a user seeking to validate technology file design rules may operate the electronic device implementing the system 800. Accordingly, in an example, the processor 802 may be configured to obtain a technology file from the storage 810. As described above, the storage 810 may be an internal storage or an external storage. The technology file includes the plurality of design rules that are to be validated.

Subsequent to the obtaining of the technology file, the processor 802 may be configured to obtain an input test library that includes a plurality of design rule cell-views corresponding to the plurality of design rules. In an example, each of the design rule cell-view includes a first set of failed test cases associated with the corresponding design rule. In an example, the first set of failed test cases is marked as per a first marking scheme.

Furthermore, each of the plurality of design rule cell-views include a plurality of test cases. Herein, each test case of the plurality of test cases is one of pass test case and fail test case. Accordingly, as per the first marking scheme, the processor 802 may be configured to add a marker layer to each of the plurality of test cases included in the design rule cell-view. Herein, a first marker is added when the test case is a fail test case and a second marker is added when the test case is a pass test case.

In further aspects, a marker text indicative of the corresponding design rule to each of the plurality of test cases included in the design rule cell-view may also be added by the processor 802.

In an example embodiment, for each of the design rule cell-view, the processor 802 may be configured to perform a check on whether the plurality of test cases included in the design rule cell-view is compliant with one or more DRD tool requirements. Accordingly, the processor 802 may be configured to modify at least one test case that is determined to be non-compliant to the one or more DRD tool requirements.

Thereafter, the processor 802 may be configured to test the plurality of design rules based on the plurality of design rule cell-views using a Design Rule Driven (DRD) tool. As a result of the testing, test output date is obtained. In the test output data, for each of the plurality of design rules, there is included a second set of failed test cases associated with the corresponding design rule. In an example, the second set of failed test cases is marked as per a second marking scheme.

Based on the first set of failed test cases and the second set of failed test cases associated with the design rule, the processor 802 may be configured to determine a validation result for each of the plurality of design rules. In an example, the validation result is indicative of efficacy of the design rule. For determining the validation result for a design rule, the processor 802 may be configured to compare the first set of failed test cases with the second set of failed test cases. Accordingly, the processor 802 may identify a number of failed test cases that are included in both the first set of failed test cases and the second set of failed test cases. In an example, the processor 802 may make this determination based on the first marking scheme and the second marking scheme. Subsequently, the processor 802 determines a percentage based on the identified number of failed test cases and the first set of failed test cases. Thereafter, the processor 802 may be configured to determine the percentage as the validation result for the design rule.

Once the validation result for each of the plurality of design rules is determined, the processor 802 may be configured to generate a validation report including the validation result for each of the plurality of design rules. This validation report, in an example, may be viewed by the user to identify any anomalies or discrepancies.

In an example embodiment, the processor 802 may be configured to identify a design rule in the plurality of design rules for which a corresponding design rule cell-view is not available in the plurality of design rule cell-views. Accordingly, the processor 802 may be configured to mark the design rule in the validation report to indicate that the corresponding design rule cell-view for the design rule is not available in the plurality of design rule cell-views. Thus, from the validation report, the user is able to identify such rules and may accordingly resolve them. For instance, corresponding rule cell views for them may be added.

Figure 9:
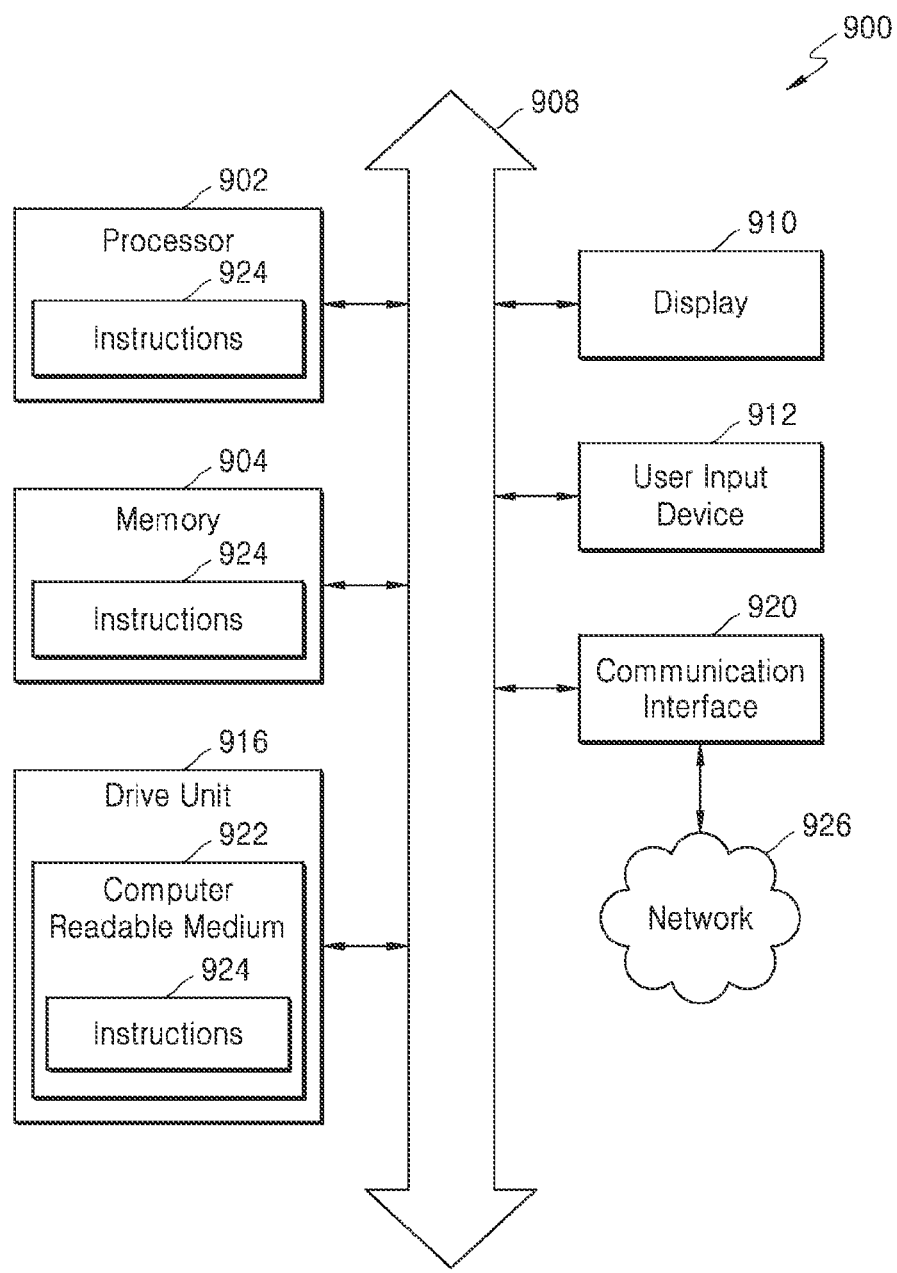
FIG. 9 illustrates a computing-device based implementation of the system of FIG. 8, according to some implementations of the disclosure.

FIG. 9 shows yet another exemplary implementation in accordance with the embodiment of the invention; and yet another hardware configuration of the system 800 in the form of a computer system 900 is shown. The computer system 900 can include a set of instructions that can be executed to cause the computer system 900 to perform any one or more of the methods disclosed. The computer system 900 may operate as a standalone device or may be connected, e.g., using a network, to other computer systems or peripheral devices.

In a networked deployment, the computer system 900 can be implemented as or incorporated across various devices, such as a tablet PC, a personal digital assistant (PDA), a mobile-device, a palmtop computer, a laptop computer, a desktop computer, a server, a cloud server, a remote server, a communications device, a wireless-telephone, or any other machine controllable through a wireless-network and capable of executing a set of instructions (sequential or otherwise) that specify actions to be taken by that machine. Further, while a single computer system 900 is illustrated, the term "system" shall also be taken to include any collection of systems or sub-systems that individually or jointly execute a set, or multiple-sets, of instructions to perform one or more computer functions.

The computer system 900 may include a processor 902 e.g., a central processing unit (CPU), a graphics processing unit (GPU), or both. The processor 902 may be a component in a variety of systems. For example, the processor 902 may be part of a standard personal computer or a workstation. The processor 902 may be one or more general processors, digital signal processors, application specific integrated circuits, field programmable gate arrays, servers, networks, digital circuits, analog circuits, combinations thereof, or other now known or later developed devices for analysing and processing data. The processor 902 may implement a software program, such as code generated manually (i.e., programmed).

The computer system 900 may include a memory 904, such as a memory 904 that can communicate via a bus 908. The memory 904 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, optical media and the like. In one example, the memory 904 includes a cache or random access memory for the processor 902. In alternative examples, the memory 904 is separate from the processor 902, such as a cache memory of a processor, the system memory, or other memory. The memory 904 may be an external storage device or database for storing data. The memory 904 is operable to store instructions executable by the processor 902. The functions, acts or tasks illustrated in the figures or described may be performed by the programmed processor 902 executing the instructions stored in the memory 904. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the computer system 900 may or may not further include a touch-sensitive display unit 910, for outputting determined information as well as receiving a user's touch-gesture based inputs, such as drag and drop, single tap, multiple-taps, etc. The display 910 may act as an interface for the user to see the functioning of the processor 902, or specifically as an interface with the software stored in the memory 904 or in the drive unit 916.

Additionally, the computer system 900 may include an input device 912 configured to allow a user to interact with any of the components of system 900. The present invention contemplates a computer-readable medium 922 that includes instructions 924 or receives and executes instructions 924 responsive to a propagated signal so that a device connected to a network 926 can communicate voice, video, audio, images or any other data over the network 926. Further, the instructions 924 may be transmitted or received over the network 926 via a communication port or interface 920 or using the bus 908. The communication port or interface 920 may be a part of the processor 902 or may be a separate component. The communication port 920 may be created in software or may be a physical connection in hardware. The communication port 920 may be configured to connect with a network 926, external media, the display 910, or any other components in the computer system 900, or combinations thereof. The connection with the network 926 may be established wirelessly as discussed later. Likewise, the additional connections with other components of the computer system 900 may be established wirelessly. The network 926 may alternatively be directly connected to the bus 908.

The network 926 may include wireless networks that may be a cellular telephone network, an 802.11, 802.16, 802.20, 802.1Q or WiMax network. Further, the network 926 may be a public network, such as the Internet, a private network, such as an intranet, or combinations thereof, and may utilize a variety of networking protocols now available or later developed including, but not limited to TCP/IP based networking protocols. The system is not limited to operation with any particular standards and protocols. For example, standards for Internet and other packet switched network transmission (e.g., TCP/IP, UDP/IP, HTML, HTTP) may be used.

Embodiments of the present disclosure provide several advantages. For example, an end-to-end fully automated trading with no dependency on manual intervention is enabled by some implementations of the present disclosure. Some implementations of the present disclosure mitigate financial risk to promote stable returns of a financial instrument in a financial market. Some implementations of the present disclosure are completely online thus can be implemented using simple user interface designs. Some implementations of the present disclosure provide an interactive chatbot assistant for communicating with users on decisions and/or statuses related to the financial instrument. Some implementations of the present disclosure provide a plug and play platform architecture for enabling trading on multiple asset classes.

Some applications of embodiments of the present disclosure include reduced-risk investing, convenient savings tool, AI trading, retirement planner, portfolio management, financial management, etc.

According to some embodiments of the present disclosure, processes described above with reference to flow charts or flow diagrams (e.g., in FIGS. 2-3) may be implemented in a computer software program. For example, some embodiments of the present disclosure include a computer program product, which includes a computer program that is carried in a computer readable medium. The computer program includes program codes for executing the processes of FIGS. 2 and/or 3. The computer program may be downloaded and installed from a network (e.g., the Internet, a local network, etc.) and/or may be installed from a removable medium (e.g., a removable hard drive, a flash drive, an external drive, etc.). The computer program, when executed by a central processing unit implements the above functions defined by methods and flow diagrams provided herein in the present disclosure.

A computer readable medium according to the present disclosure may be a computer readable signal medium or a computer readable storage medium or any combination of the above two. Examples of the computer readable storage medium may include electric, magnetic, optical, electromagnetic, infrared, or semiconductor systems, elements, apparatuses, or a combination of any of the above. More specific examples of the computer readable storage medium include a portable computer disk, a hard disk, a random access memory (RAM), a read only memory (ROM), an erasable programmable read only memory (EPROM or flash memory), an optical fiber, a portable compact disk read only memory (CD-ROM), an optical memory, a magnetic memory, or any suitable combination of the above.

The computer readable storage medium according to some embodiments may be any tangible medium containing or storing programs, which may be used by, or used in combination with, a command execution system, apparatus or element. In some embodiments of the present disclosure, the computer readable signal medium may include a data signal in the base band or propagating as a part of a carrier wave, in which computer readable program codes are carried. The propagating data signal may take various forms, including but not limited to an electromagnetic signal, an optical signal, or any suitable combination of the above. The computer readable signal medium may also be any computer readable medium except for the computer readable storage medium. The computer readable medium is capable of transmitting, propagating or transferring programs for use by, or used in combination with, a command execution system, apparatus or element. The program codes contained on the computer readable medium may be transmitted with any suitable medium, including but not limited to: wireless, wired, optical cable, RF medium, etc., or any suitable combination of the above.

A computer program code for executing operations in the present disclosure may be compiled using one or more programming languages or combinations thereof. The programming languages include object-oriented programming languages, such as Java or C++, and also include conventional procedural programming languages, such as "C" language or similar programming languages. The program code may be completely executed on a user's computer, partially executed on a user's computer, executed as a separate software package, partially executed on a user's computer and partially executed on a remote computer, or completely executed on a remote computer or electronic device. In the circumstance involving a remote computer, the remote computer may be connected to a user's computer through any network, including local area network (LAN) or wide area network (WAN), or be connected to an external computer (for example, connected through the Internet using an Internet service provider).

The flow charts and block diagrams in the accompanying drawings illustrate architectures, functions and operations that may be implemented according to the systems, methods and computer program products of the various embodiments of the present disclosure. Each of the blocks in the flow charts or block diagrams may represent a program segment or code that includes one or more executable instructions for implementing specified logical functions. It should be further noted that, in some alternative implementations, the functions denoted by the flow charts and block diagrams may also occur in a sequence different from the sequences shown in the figures. For example, any two blocks presented in succession may be executed substantially in parallel, or sometimes be executed in a reverse sequence, depending on the functions involved. It should be further noted that each block in the block diagrams and/or flow charts as well as a combination of blocks in the block diagrams and/or flow charts may be implemented using a dedicated hardware-based system executing specified functions or operations, or by a combination of dedicated hardware and computer instructions.

Engines, handlers, generators, managers, or any other software block or hybrid hardware-software block identified in some embodiments of the present disclosure may be implemented by software, or may be implemented by hardware. The described blocks may also be provided in a processor, for example, described as: a processor including an application programming interface, a neural network engine, a natural language processing engine, a predictive model engine, etc.

While specific language has been used to describe the present disclosure, any limitations arising on account thereto, are not intended. As would be apparent to a person in the art, various working modifications may be made to the method to implement the inventive concept as taught herein. The drawings and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment.

We claim:

1. A method of validating technology file design rules, the method comprising:
   obtaining a technology file including a plurality of design rules that are to be validated;
   obtaining an input test library including a plurality of design rule cell-views corresponding to the plurality of design rules, wherein each design rule cell-view includes a first set of failed test cases associated with a corresponding one of the plurality of design rules;
   testing, using a Design Rule Driven (DRD) tool, the plurality of design rules based on the plurality of design rule cell-views to obtain test output data, wherein the test output data includes, for each of the plurality of design rules, a second set of failed test cases associated with the corresponding one of the plurality of design rules;
   determining a validation result for each of the plurality of design rules based on the first set of failed test cases and the second set of failed test cases associated with the corresponding one of the plurality of design rules, the validation result being indicative of efficacy of the corresponding one of the plurality of design rules; and
   generating a validation report including the validation result for each of the plurality of design rules.

2. The method as claimed in claim 1, wherein the first set of failed test cases are marked as per a first marking scheme and wherein the second set of failed test cases are marked as per a second marking scheme.

3. The method as claimed in claim 2, wherein determining the validation result, comprises:
   for each of the plurality of design rules:
   comparing the first set of failed test cases with the second set of failed test cases;
   identifying a number of failed test cases that are included in both the first set of failed test cases and the second set of failed test cases, based on the first marking scheme and the second marking scheme;
   determining a percentage based on the identified number of failed test cases and the first set of failed test cases; and
   determining the percentage as the validation result for the corresponding one of the plurality of design rules.

4. The method as claimed in claim 1, wherein the method further comprises:
   identifying a design rule in the plurality of design rules for which a corresponding design rule cell-view is not available in the plurality of design rule cell-views; and
   marking the corresponding one of the plurality of design rules in the validation report to indicate that the corresponding design rule cell-view for the corresponding one of the plurality of design rules is not available in the plurality of design rule cell-views.

5. The method as claimed in claim 1, wherein each of the plurality of design rule cell-views include a plurality of test cases, wherein each test case of the plurality of test cases is one of pass test case and fail test case.

6. The method as claimed in claim 5, wherein the method further comprises:
   for each of the plurality of design rule cell-views;
   performing a check on whether the plurality of test cases included in the design rule cell-view is compliant with one or more DRD tool requirements; and
   modifying at least one test case that is determined to be non-compliant to the one or more DRD tool requirements.

7. The method as claimed in claim 5, wherein the method further comprises:
   for each of the plurality of design rule cell-views,
   adding a marker layer to each of the plurality of test cases included in the design rule cell-view as per a first marking scheme, wherein a first marker is added when the test case is a fail test case, and wherein a second marker is added when the test case is a pass test case.

8. The method as claimed in claim 5, wherein the method further comprises:
   for each of the plurality of design rule cell-views:
   adding a marker text indicative of the corresponding one of the plurality of design rules to each of the plurality of test cases included in the design rule cell-view.

9. The method as claimed in claim 1, further comprising:
   resolving a first design rule, among the plurality of design rules, that is indicated in the validation report as having a corresponding design rule cell-view, among the plurality of design rule cell-views, that is not available; and manufacturing an integrated circuit based on the validation report.

10. A system for validating technology file design rules, the system comprising:
- a processor; and
- a memory device containing instructions, which when executed by the processor, cause the processor to:
    - obtain a technology file including a plurality of design rules that are to be validated;
    - obtain an input test library from an internal storage or a remote storage of the system, wherein the input test library includes a plurality of design rule cell-views corresponding to the plurality of design rules, wherein each design rule cell-view includes a first set of failed test cases associated with a corresponding one of the plurality of design rules;
    - test, using a Design Rule Driven (DRD) tool with specification requirements of the DRD tool, the plurality of design rules based on the plurality of design rule cell-views to obtain test output data, wherein the test output data includes, for each of the plurality of design rules, a second set of failed test cases associated with the corresponding one of the plurality of design rules;
    - determine a validation result for each of the plurality of design rules based on the first set of failed test cases and the second set of failed test cases associated with the corresponding one of the plurality of design rules, the validation result being indicative of efficacy of the corresponding one of the plurality of design rules; and
    - generate a validation report including the validation result for each of the plurality of design rules.

11. The system as claimed in claim 10, wherein the first set of failed test cases are marked as per a first marking scheme and wherein the second set of failed test cases are marked as per a second marking scheme.

12. The system as claimed in claim 11, wherein for determining the validation result, comprises, the processor is further configured to:
- for each of the plurality of design rules:
    - compare the first set of failed test cases with the second set of failed test cases;
    - identify a number of failed test cases that are included in both the first set of failed test cases and the second set of failed test cases, based on the first marking scheme and the second marking scheme;
    - determine a percentage based on the identified number of failed test cases and the first set of failed test cases; and
    - determine the percentage as the validation result for the corresponding one of the plurality of design rules.

13. The system as claimed in claim 10, wherein the processor is further configured to:
- identify a design rule in the plurality of design rules for which a corresponding design rule cell-view is not available in the plurality of design rule cell-views; and
- mark the corresponding one of the plurality of design rules in the validation report to indicate that the corresponding design rule cell-view for the corresponding one of the plurality of design rules is not available in the plurality of design rule cell-views.

14. The system as claimed in claim 10, wherein each of the plurality of design rule cell-views include a plurality of test cases, wherein each test case of the plurality of test cases is one of pass test case and fail test case.

15. The system as claimed in claim 14, wherein the processor is further configured to, for each of the plurality of design rule cell-views:
- perform a check on whether the plurality of test cases included in the design rule cell-view is compliant with one or more DRD tool requirements; and
- modify at least one test case that is determined to be non-compliant to the one or more DRD tool requirements.

16. The system as claimed in claim 14, wherein the processor is further configured to, for each of the plurality of design rule cell-views:
- add a marker layer to each of the plurality of test cases included in the design rule cell-view as per a first marking scheme, wherein a first marker is added when the test case is a fail test case, and wherein a second marker is added when the test case is a pass test case.

17. The system as claimed in claim 14, wherein the processor is further configured to, for each of the plurality of design rule cell-views:
- add a marker text indicative of the corresponding one of the plurality of design rules to each of the plurality of test cases included in the design rule cell-view.

18. The system as claimed in claim 10, wherein the processor is further configured to:
- resolve a first design rule, among the plurality of design rules, that is indicated in the validation report as having a corresponding design rule cell-view, among the plurality of design rule cell-views, that is not available.

19. The system as claimed in claim 18, wherein the resolved first design rule is used to manufacture an integrated circuit.

20. A method of validating technology file design rules, the method comprising:
- obtaining a technology file including a plurality of design rules that are to be validated;
- obtaining an input test library including a plurality of design rule cell-views corresponding to the plurality of design rules, wherein each design rule cell-view includes a first set of failed test cases associated with a corresponding one of the plurality of design rules;
- testing, using a Design Rule Driven (DRD) tool, the plurality of design rules based on the plurality of design rule cell-views to obtain test output data, wherein the test output data includes, for each of the plurality of design rules, a second set of failed test cases associated with the corresponding one of the plurality of design rules;
- determining a validation result for each of the plurality of design rules based on the first set of failed test cases and the second set of failed test cases associated with the corresponding one of the plurality of design rules, the validation result being indicative of efficacy of the corresponding one of the plurality of design rules; and
- generating a validation report including the validation result for each of the plurality of design rules,
- wherein the first set of failed test cases include a layout of a circuit design which is not as per constraints defined by the corresponding one of the plurality of design rules,
- wherein each of the plurality of design rule cell-views includes a plurality of test cases,
- wherein each test case of the plurality of test cases is one of pass test case and fail test case, and
- wherein the method further comprises:
    - for each of the plurality of design rule cell-views;
        - performing a check on whether the plurality of test cases is compliant with one or more DRD tool requirements; and modifying at least one test case that is determined to be non-compliant to the one or more DRD tool requirements.

\* \* \* \* \*